United States Patent [19]
Chen

[11] Patent Number: 5,976,392
[45] Date of Patent: Nov. 2, 1999

[54] METHOD FOR FABRICATION OF THIN FILM RESISTOR

[75] Inventor: Wood Mu-Yuan Chen, Saratoga, Calif.

[73] Assignee: Yageo Corporation, Taipei, Taiwan

[21] Appl. No.: 08/813,566

[22] Filed: Mar. 7, 1997

[51] Int. Cl.⁶ .................................................. H01L 21/302
[52] U.S. Cl. ........................ 216/16; 216/65; 216/66; 427/261; 427/264; 427/404; 427/419.7
[58] Field of Search ................................ 216/16, 65, 66; 204/192.34; 427/123, 126.1, 126.2, 261, 264, 269, 270, 271, 404, 419.7

[56] References Cited

U.S. PATENT DOCUMENTS

| | | | |
|---|---|---|---|
| 3,392,440 | 7/1968 | Yanagawa | 29/578 |
| 3,779,841 | 12/1973 | Sanders | 156/8 |
| 4,042,479 | 8/1977 | Yamazski et al. | 204/192 |
| 4,063,211 | 12/1977 | Yasujima et al. | 338/308 |
| 4,338,145 | 7/1982 | Yasujima et al. | 148/133 |
| 4,434,416 | 2/1984 | Schonberger | 338/22 R |
| 4,510,178 | 4/1985 | Paulson et al. | 427/94 |
| 4,563,564 | 1/1986 | Ericsen et al. | 219/121 LJ |
| 4,801,469 | 1/1989 | Norwood | 427/103 |
| 4,987,010 | 1/1991 | Krause et al. | 427/103 |
| 5,023,589 | 6/1991 | Hall | 338/308 |
| 5,189,580 | 2/1993 | Pisharody et al. | 360/126 |
| 5,221,639 | 6/1993 | White | 216/16 |
| 5,227,012 | 7/1993 | Brandli et al. | 156/643 |
| 5,502,885 | 4/1996 | Hanamura et al. | 29/621 |
| 5,683,928 | 11/1997 | Wojnarowski et al. | 437/60 |
| 5,703,630 | 12/1997 | Murakami et al. | 347/45 |
| 5,874,764 | 2/1999 | Hsieh et al. | 257/401 |

FOREIGN PATENT DOCUMENTS

2555800 A  5/1985  France.

*Primary Examiner*—Frankie L. Stinson
*Assistant Examiner*—Anita Alanko
*Attorney, Agent, or Firm*—George O. Saile; Stephen B. Ackerman; Alek P. Szecsy

[57] ABSTRACT

A method for forming a thin film resistor. There is first provided an insulator substrate. There is then formed upon the insulator substrate a blanket thin film resistive layer. There is then removed through a non-photolithographic etching method a portion of the blanket thin film resistive layer to form upon the substrate a patterned thin film resistive layer. Finally, there is then formed through a non-photolithographic printing method upon the patterned thin film resistive layer a patterned conductor lead layer. Alternatively, the portion of the blanket thin film resistive layer may be removed to form the patterned thin film resistive layer after the patterned conductor lead layer is formed upon the blanket thin film resistive layer. Additionally, the insulator substrate may be scribed before or after forming the blanket thin film resistive layer upon the insulator substrate to form a contiguous substrate chip upon which is formed the patterned thin film resistive layer and the patterned conductor lead layer, thus forming a contiguous thin film resistor chip within the insulator substrate. The contiguous thin film resistor chip may then be parted from the insulator substrate to form a discrete thin film resistor chip through physical fracture without cutting the insulator substrate.

11 Claims, 6 Drawing Sheets

METHOD FOR FABRICATION OF THIN FILM RESISTOR

BACKGROUND OF THE INVENTION

1. Field of the Invention

The present invention relates generally to methods and materials for fabricating thin film resistors employed within microelectronics fabrications. More particularly, the present invention relates to methods and materials for efficiently and economically fabricating thin film resistors employed within thin film resistor components, such as but not limited to thin film resistor chips, within microelectronics fabrications, such as but not limited to hybrid circuit microelectronics fabrications.

2. Description of the Related Art

Common in the art of microelectronics fabrication is the use of thin film resistors as passive electrical circuit elements and/or load bearing electrical circuit elements within electrical circuits. Thin film resistors may be employed within electrical circuits within microelectronics fabrications including but not limited to integrated circuit microelectronics fabrications and hybrid circuit microelectronics fabrications.

When employed within integrated circuit microelectronics fabrications, thin film resistors are typically formed through photolithographic patterning, through methods as are conventional in the art, of blanket layers of thin film resistor materials formed upon insulator layers which in turn are formed over semiconductor substrates, portions of which semiconductor substrates are subsequently parted to form integrated circuit chips. Similarly, when employed within hybrid circuit microelectronics fabrications, thin film resistors are typically formed through photolithographic patterning, through methods as are conventional in the art, of blanket layers of thin film resistor materials which are formed upon insulator substrates, such as but not limited to glass insulator substrates and ceramic insulator substrates, portions of which insulator substrates are subsequently parted to form discrete thin film resistor chips.

When forming thin film resistors employed in either integrated circuit microelectronics fabrications or hybrid circuit microelectronics fabrications it is common in the pertinent art, after having formed a photolithographically patterned layer of a thin film resistor material, to trim with a focused laser beam portions of the photolithographically patterned layer of the thin film resistor material to form a trimmed patterned photolithographically patterned layer of the thin film resistor material from which is subsequently formed an integrated thin film resistor within an integrated circuit chip or a discrete thin film resistor within a discrete thin film resistor chip. Through the laser trimming method there is provided an integrated thin film resistor or a discrete thin film resistor having a precise and controlled resistance.

While the use of photolithographic patterning methods in conjunction with laser trimming methods for forming discrete thin film resistors upon insulator substrates which are subsequently parted in forming discrete thin film resistor chips for use within hybrid circuit microelectronics fabrications has thus become quite common in the art of hybrid circuit microelectronics fabrication, the use of photolithographic methods in conjunction with laser trimming methods for forming discrete thin film resistors upon insulator substrates which are subsequently parted in forming discrete thin film resistor chips for use within hybrid circuit microelectronics fabrications is not entirely without problems. In particular, in comparison with the art of integrated circuit fabrication, where several patterned layers or patterned regions within an integrated circuit in addition to a patterned thin film resistor layer within the integrated circuit are typically formed through photolithographic methods, when forming a discrete thin film resistor chip to be employed within a hybrid circuit microelectronics fabrication it is common that the only patterned layers to be formed through photolithographic methods are: (1) a patterned thin film resistor layer; and (2) a pair of patterned conductor lead layers formed contacting the patterned thin film resistor layer. Thus, within discrete thin film resistor chip fabrication, photolithographic apparatus and materials are typically generally inefficiently employed when forming discrete thin film resistor chips, thus ultimately adding additional fabrication costs to discrete thin film resistor chips.

As an additional consequence of employing photolithographic methods in forming patterned thin film resistor layers and patterned conductor lead layers upon insulator substrates portions of which are subsequently parted in forming discrete thin film resistor chips, there is also typically required insulator substrates of enhanced surface flatness and finish in order to provide for adequate registration of those insulator substrates within conventional photolithographic apparatus which are employed in forming patterned thin film resistor layers and patterned conductor lead layers contacting those patterned thin film resistor layers. Insulator substrates of enhanced flatness and finish also add fabrication cost to discrete thin film resistor chips formed through such conventional photolithographic methods and apparatus.

It is thus towards the goal of providing a method for forming discrete thin film resistors for use within discrete thin film resistor chips employed within hybrid circuit microelectronics fabrications, while: (1) avoiding discrete thin film resistor fabrication costs associated with photolithographic methods, materials and apparatus conventionally employed in forming discrete thin film resistors; and (2) avoiding discrete thin film resistor fabrication costs associated with insulator substrates of enhanced flatness and surface finish conventionally employed in forming discrete thin film resistors for use within discrete thin film resistor chips, that the present invention is directed.

Various disclosures pertaining to thin film resistor design and fabrication may be found in the art. Most commonly, the disclosures are directed towards thin film resistor materials and methods for fabrication of thin film resistors employing the thin film resistor materials, where the thin film resistors so formed exhibit improved or controlled thin film resistor properties, such as but not limited to sheet resistance, thermal coefficient of resistivity (TCR) and thermal stability. See, for example: (1) Yamazaki et al. in U.S. Pat. No. 4,042,479 (improved thin film resistors formed from tantalum-aluminum nitride thin film resistor materials); (2) Yasujima et al. in U.S. Pat. No. 4,063,211 (improved thin film resistors formed from tantalum silicide thin film resistor materials); (3) Yasujima et al. in U.S. Pat. No. 4,338,145 (improved thin film resistors formed from tantalum-chromium alloy thin film resistor materials); (4) Paulson et al. in U.S. Pat. No. 4,510,178 (improved thin film resistors formed from chromium silicide/nitride thin film resistor materials); (5) Hall, in U.S. Pat. No. 5,023,589 (improved thin film resistors formed from gold doped nickel-chromium alloy thin film resistor materials); and (6) Krause et al., in U.S. Pat. No. 4,987,010 (improved thin film resistors formed from plasma enhanced chemical vapor deposited (PECVD) insulator layer overcoated platinum thin film resistor materials).

Desirable in the art are additional methods and materials through which there may be formed discrete thin film resistors for use within discrete thin film resistor chips employed within hybrid circuit microelectronic fabrications, where the discrete thin film resistors may be formed: (1) while avoiding use of photolithographic methods, materials and apparatus in forming the discrete thin film resistors; and (2) while avoiding use of highly polished substrates in forming the discrete thin film resistors. It is towards the foregoing goals that the present invention is specifically directed.

SUMMARY OF THE INVENTION

A first object of the present invention is to provide a method for forming a discrete thin film resistor for use within a thin film resistor component, such as but not limited to a discrete thin film resistor chip, employed within hybrid circuit microelectronics fabrications.

A second object of the present invention is to provide a method in accord with the first object of the present invention, where the discrete thin film resistor is formed while avoiding photolithographic methods, materials and apparatus in forming the discrete thin film resistor.

A third object of the present invention is to provide a method in accord with the first object of the present invention, where the discrete thin film resistor is formed without employing a highly polished substrate in forming the discrete thin film resistor.

A fourth object of the present invention is to provide a method in accord with the second object of the present invention or the third object of the present invention, which method is readily manufacturable.

In accord with the objects of the present invention, there is provided by the present invention a method for forming a discrete thin film resistor. To practice the method of the present invention, there is first provided an insulator substrate. There is then formed upon the insulator substrate a blanket thin film resistive layer through a thin film deposition method. There is then removed through a non-photolithographic energy beam etching method a portion of the blanket thin film resistive layer to form upon the substrate a patterned thin film resistive layer. Finally, there is then formed through a non-photolithographic printing method upon the patterned thin film resistive layer a patterned conductor lead layer. As an alternative embodiment of the present invention, the portion of the blanket thin film resistive layer may be removed to form the patterned thin film resistive layer after the patterned conductor lead layer is formed upon the blanket thin film resistive layer. Additionally, the insulator substrate employed within the method of the present invention may be scribed before or after forming the blanket thin film resistive layer upon the insulator substrate to thus form a contiguous insulator substrate chip within the insulator substrate, upon which contiguous insulator substrate chip is formed the patterned thin film resistive layer and the patterned conductor lead layer, thus forming a contiguous thin film resistor chip within the insulator substrate. The contiguous thin film resistor chip may then be parted by fracture of the insulator substrate to form a discrete thin film resistor chip without cutting the insulator substrate.

The present invention provides a method for forming a discrete thin film resistor for use within a thin film resistor component, such as but not limited to a discrete thin film resistor chip, employed within hybrid circuit microelectronics fabrications, where: (1) the discrete thin film resistor is formed while avoiding photolithographic methods, materials and apparatus in forming the discrete thin film resistor; and (2) the discrete thin film resistor is formed without employing a highly polished substrate in forming the discrete thin film resistor. The method of the present invention achieves these objects by employing: (1) a non-photolithographic energy beam etching method for forming from a blanket resistive layer a patterned resistive layer employed within the discrete thin film resistor; and (2) a non-photolithographic printing method for forming upon the blanket resistive layer or the patterned resistive layer a patterned conductor lead layer employed within the discrete thin film resistor. Due to the absence of photolithographic methods when forming the patterned resistive layer and the patterned conductor lead layer employed within the discrete thin film resistor formed through the method of the present invention, there may be employed when forming the discrete thin film resistor of the present invention an insulator substrate layer which is not highly polished. Thus, there is provided through the present invention a method for forming a discrete thin film resistor for use within a thin film resistor component, such as but not limited to a discrete thin film resistor chip, employed within hybrid circuit microelectronics fabrications, where: (1) the discrete thin film resistor is formed while avoiding photolithographic methods, materials and apparatus in forming the discrete thin film resistor; and (2) the discrete thin film resistor is formed without employing a highly polished substrate in forming the discrete thin film resistor.

The method of the present invention is readily manufacturable. The method of the present invention provides for use of: (1) a non-photolithographic energy beam etching method for forming a patterned thin film resistive layer from a blanket thin film resistive layer for use within a discrete thin film resistor, where a patterned thin film resistive layer employed within a discrete thin film resistor is otherwise conventionally formed from a blanket thin film resistive layer through a photolithographic method; and (2) a non-photolithographic printing method for forming a patterned conductor lead layer upon the blanket thin film resistive layer or a patterned thin film resistive layer formed from the blanket thin film resistive layer, where a patterned conductor lead layer employed within a discrete thin film resistor is similarly also otherwise conventionally formed through a photolithographic method. Methods and materials through which non-photolithographic energy beam etching methods and non-photolithographic printing methods may be provided are generally known in the art of resistor fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1b to FIG. 7 show a series of schematic cross-sectional diagrams illustrating the results of progressive stages in forming upon the insulator substrate as illustrated in FIG. 1a a series of discrete thin film resistors and a discrete thin film resistor chip through the preferred embodiment of the method of the present invention.

DESCRIPTION OF THE PREFERRED EMBODIMENT

Figure 1A:
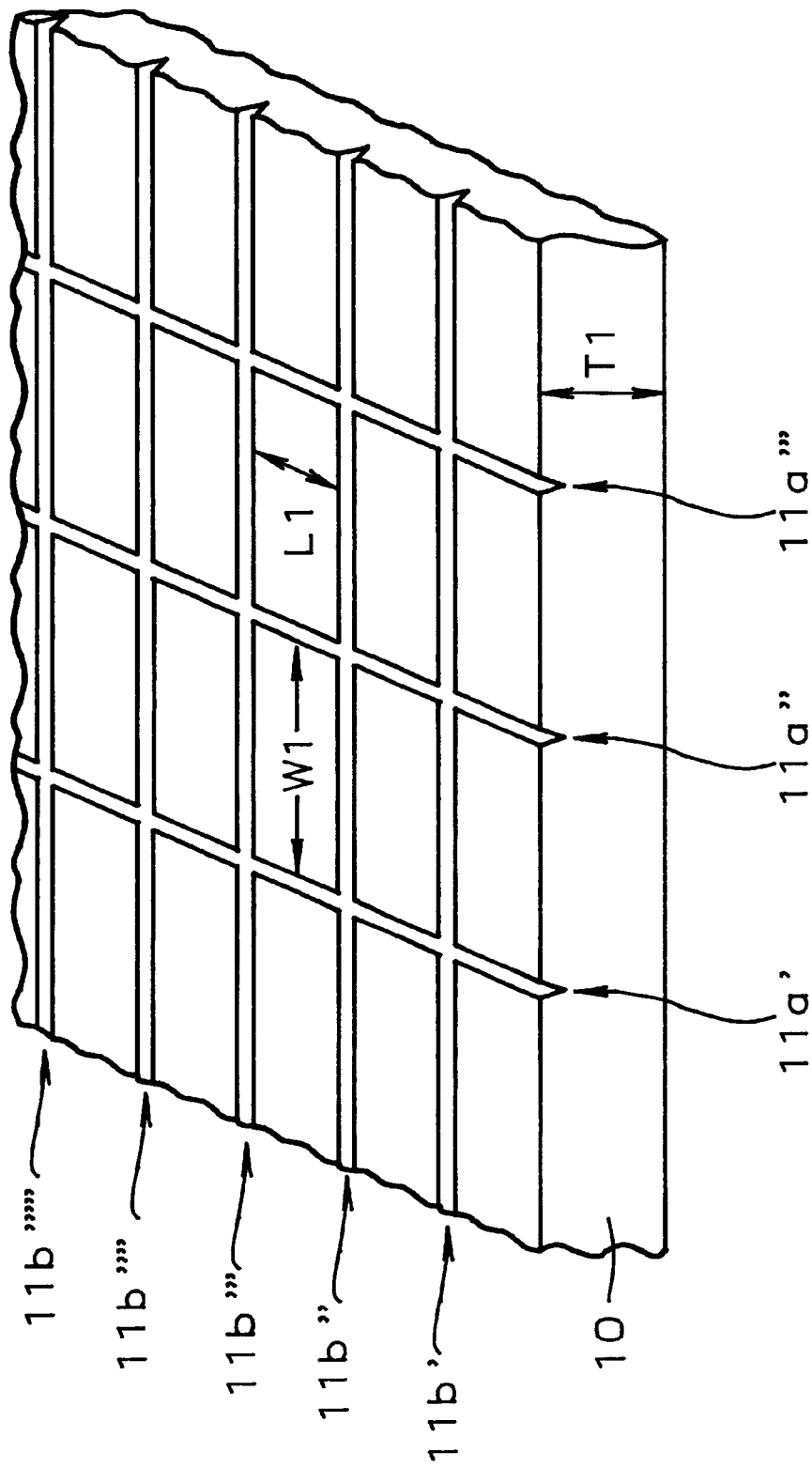
FIG. 1a shows a schematic perspective view diagram of a scribed insulator substrate employed within the preferred embodiment of the method of the present invention.

The present invention provides a method for forming a discrete thin film resistor for use within a thin film resistor component, such as but not limited to a discrete thin film resistor chip, employed within hybrid circuit microelectronics fabrications, where when forming the discrete thin film resistor there is avoided: (1) the use of photolithographic methods, materials and apparatus, and (2) the use of a highly polished insulator substrate. The method of the present invention achieves the foregoing goals through employing: (1) a non-photolithographic energy beam etching method in forming a patterned thin film resistive layer from a blanket thin film resistive layer within the discrete thin film resistor; and (2) a non-photolithographic printing method for forming a patterned conductor lead layer upon the blanket thin film resistive layer or the patterned thin film resistive layer within the discrete thin film resistor. Since there is avoided through the method of the present invention the use of photolithographic methods, materials and apparatus when forming the patterned resistive layer and the patterned conductor lead layer within the discrete thin film resistor, there may be avoided the use of a highly polished insulator substrate when forming the discrete thin film resistor. Similarly, as the method of the present invention avoids the use of a highly polished insulator substrate when forming the discrete thin film resistor, the method of the present invention thus allows the use of a scribed insulator substrate when forming the discrete thin film resistor. The use of the scribed insulator substrate provides additional advantages in fabricating the thin film resistor of the present invention into a thin film resistor component, such as but not limited to a discrete thin film resistor chip.

While the preferred embodiment of the method of the present invention illustrates the method of the present invention employed in forming a discrete thin film resistor within a discrete thin film resistor chip for use within a hybrid circuit microelectronics fabrication, it is nonetheless understood by a person skilled in the art that the method of the present invention may also be employed in forming discrete thin film resistors for use within thin film resistor components other than discrete thin film resistor chips within hybrid circuit microelectronics fabrications. In that regard, the method of the present invention may be employed in forming discrete thin film resistors for use within thin film resistor components including but not limited to discrete thin film resistor chips, discrete thin film resistor array chips and discrete thin film resistor network chips within hybrid circuit microelectronics fabrications. The thin film resistor components employing the discrete thin film resistors formed through the method of the present invention will typically, although not exclusively, be fabricated and employed as surface mount thin film resistor components.

Referring now to FIG. 1a to FIG. 7, there is shown a series of schematic diagrams illustrating the results of progressive stages in forming upon an insulator substrate a series of discrete thin film resistors in the process of forming a series of discrete thin film resistor chips through the preferred embodiment of the method of the present invention. Shown in FIG. 1a is a schematic perspective-view diagram of the insulator substrate prior to formation of the series of discrete thin film resistors, while there is shown in FIG. 1b a schematic cross-sectional diagram of the insulator substrate prior to formation of the series of discrete thin film resistors.

As is illustrated by the schematic perspective-view diagram of FIG. 1a, an insulator substrate 10 is multiply scribed in perpendicular directions (ie: through horizontal scribe lines 11b', 11b'', 11b''', 11b'''' and 11b'''''; and lateral scribe lines 11a', 11a'' and 11a''') to form a bidirectional array of islands within the insulator substrate 10, upon which bidirectional array of islands there is formed through the method of the present invention a bidirectional array of discrete thin film resistors. As is illustrated within FIG. 1a, each island within the bidirectional array of islands has a width W1 upon the insulator substrate 10, where the width W1 upon the insulator substrate 10 is typically and preferably from about 0.8 to about 6.5 millimeters. Similarly, as is also illustrated in FIG. 1a, each island within the bidirectional array of islands has a length L1 upon the insulator substrate 10, where the length L1 upon the insulator substrate 10 is typically and preferably from about 0.4 to about 3.5 millimeters. Finally, as is illustrated within FIG. 1a, the insulator substrate 10 also has a thickness T1, where the thickness T1 is typically and preferably from about 0.2 to about 2.0 millimeters. Insulator substrates formed with alternative dimensions for W1, L1 and T1 may, however, also be employed within the method of the present invention when there is desired to form through the method of the present invention discrete thin film resistors or thin film resistor components of atypical dimensions.

Figure 1B:
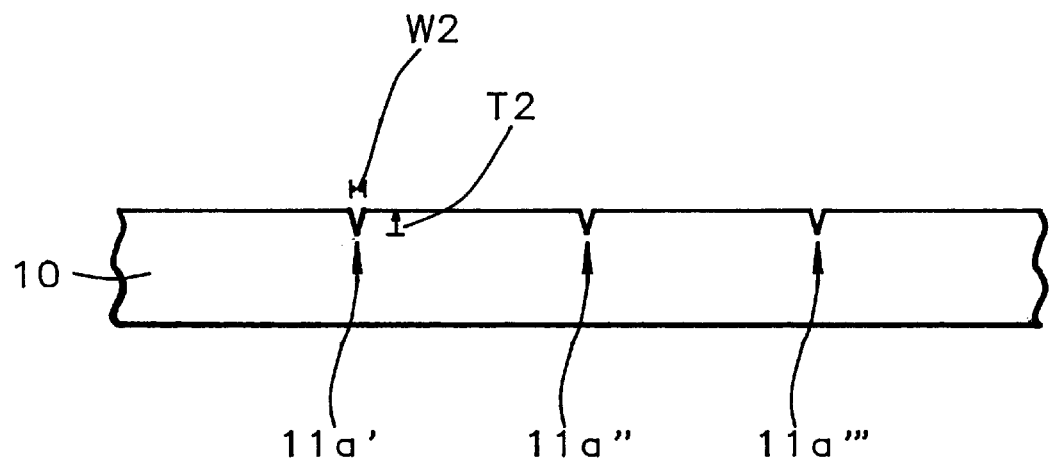

Referring now to FIG. 1b, there is shown the schematic cross-sectional diagram of the insulator substrate 10 whose schematic perspective-view diagram is shown in FIG. 1a. Shown in FIG. 1b is the series of lateral scribe lines 11a', 11a'' and 11a''' which in part defines the bidirectional array of islands within the insulator substrate 10 as illustrated within the schematic perspective-view diagram of FIG. 1a. Each scribe line within the series of lateral scribe lines 11a', 11a'' and 11a''' (as well as the series of horizontal scribe lines 11b', 11b'', 11b''', 11b'''' and 11b''''') has a width W2 upon the substrate, where the width W2 is preferably from about 10 to about 150 microns. Similarly, each scribe line within the series of lateral scribe lines 11a', 11a'' and 11a''' (as well as the series of horizontal scribe lines 11b', 11b'', 11b''', 11b'''' and 11b''''') has a depth T2 within the insulator substrate 10, where the depth T2 within the insulator substrate 10 is preferably from about 20 to about 200 microns. As is illustrated by the schematic cross-sectional diagram of FIG. 1b, each scribe line within the series of lateral scribe lines 11a', 11a'' and 11a''' (as well as the series of horizontal scribe lines 11b', 11b'', 11b''', 11b'''' and 11b''''') preferably has a "V" shaped cross-section, although scribe lines exhibiting alternative cross-section shapes, such as but not limited to straight sided and flat bottomed troughs, may also be employed within both the method of the present invention and the preferred embodiment of the method of the present invention.

The lateral and horizontal scribe lines may be formed within the insulator substrate 10 through any of several methods as are known in the art of scribing insulator substrates, such methods including but not limited to physical scribing methods employing scribes or other cutting tools, as well as ablative scribing methods employing energy beams such as but not limited to laser beams, focused electron beams and focused ion beams. The presence of the lateral and horizontal scribe lines within the insulator substrate 10 provides advantages within the method of the present invention when fabricating the bidirectional array of thin film resistors formed upon the bidirectional array of islands within the insulator substrate 10 into a series of discrete thin film resistor chips. Although the insulator substrate 10 may be scribed at a later stage in the fabrication of the bidirectional array of thin film resistors upon the insulator substrate 10, such as but not limited to a stage subsequent to forming a blanket thin film resistive layer upon the insulator substrate 10, most preferably the insulator substrate 10 employed within the method of the present invention is scribed prior to forming the bidirectional array of thin film resistors upon the insulator substrate 10, since a more optimal fabrication economy is thus achieved through the method of the present invention.

Although not specifically illustrated within the schematic perspective-view diagram of FIG. 1a or the schematic cross-sectional diagram of FIG. 1b, the insulator substrate 10 is preferably formed of an insulator material which is adequately insulating, readily scribed, readily fabricated into the form of the insulator substrate 10, and substantially inert to degradation within the thin film resistor fabrication processes to which the insulator substrate 10 is subsequently exposed. Common insulator materials which fulfill these criteria include but are not limited to high melting temperature glass insulator materials and ceramic insulator materials. Within the preferred embodiment of the method of the present invention, the insulator substrate 10 is preferably an alumina based ceramic insulator substrate having an alumina content of about 96 percent to about 99.6 percent. Other insulator materials may, however, be employed in forming the insulator substrate 10.

As is also not illustrated by the schematic perspective-view diagram of FIG. 1a or the schematic cross-sectional diagram of FIG. 1b, within the method of the present invention the insulator substrate 10 need not have a highly polished surface as is typically required and employed when fabricating microelectronics fabrications through conventional photolithographic methods. Typically, highly polished surfaces employed within microelectronics fabrications have a surface roughness of less than about 500 angstroms (peak-to-peak). Within the preferred embodiment of the method of the present invention, the insulator substrate 10 preferably has a surface roughness of from about 1000 to about 3000 angstroms (peak-to-peak) exclusive of the lateral and horizontal scribe lines.

Finally, although also not illustrated by the schematic perspective-view diagram of FIG. 1a or the schematic cross-sectional diagram of FIG. 1b, within the preferred embodiment of the method of the present invention the insulator substrate 10 is preferably pre-cleaned prior to forming upon the bidirectional array of islands within the insulator substrate 10 the bidirectional array of discrete thin film resistors. Preferably, the insulator substrate 10 is pre-cleaned through annealing at a temperature of from about 800 to about 900 degrees centigrade in dessicated air (ie: less than about 10 ppm moisture) for a time period of from about 5 to about 30 minutes.

Figure 2:
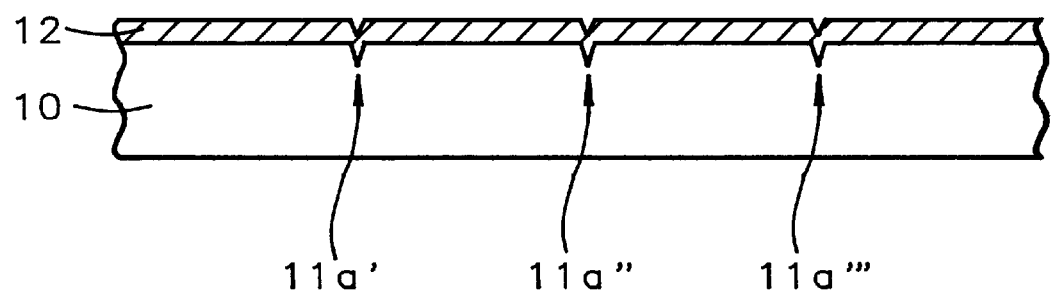

Referring now to FIG. 2, there is shown a schematic cross-sectional diagram illustrating the results of further processing of the insulator substrate 10 whose schematic cross-sectional diagram is illustrated in FIG. 1b. Shown in FIG. 2 is a schematic cross-sectional diagram of the insulator substrate 10 as illustrated in FIG. 1b, but upon whose surface is formed a blanket thin film resistive layer 12. The blanket thin film resistive layer 12 may be formed from any of several resistive materials as are known in the art of thin film resistor fabrication, including but not limited to tantalum nitride resistive materials, tantalum silicide resistive materials, tantalumchromium alloy resistive materials, nickel-chromium alloy resistive materials, chromium silicide resistive materials and higher order alloys of the foregoing resistive materials. Similarly, the blanket thin film resistive layer 12 may be formed through any of several thin film deposition methods as are known in the art of thin film resistor fabrication, including but not limited to thermally assisted evaporation methods, electron beam assisted evaporation methods, chemical vapor deposition (CVD) methods, plasma enhanced chemical vapor deposition (PECVD) methods and physical vapor deposition (PVD) sputtering methods. Within the preferred embodiment of the method of the present invention, the blanket thin film resistive layer 12 is preferably formed to a thickness of from about 0.05 to about 1.0 microns upon the insulator substrate 10.

Figure 3:
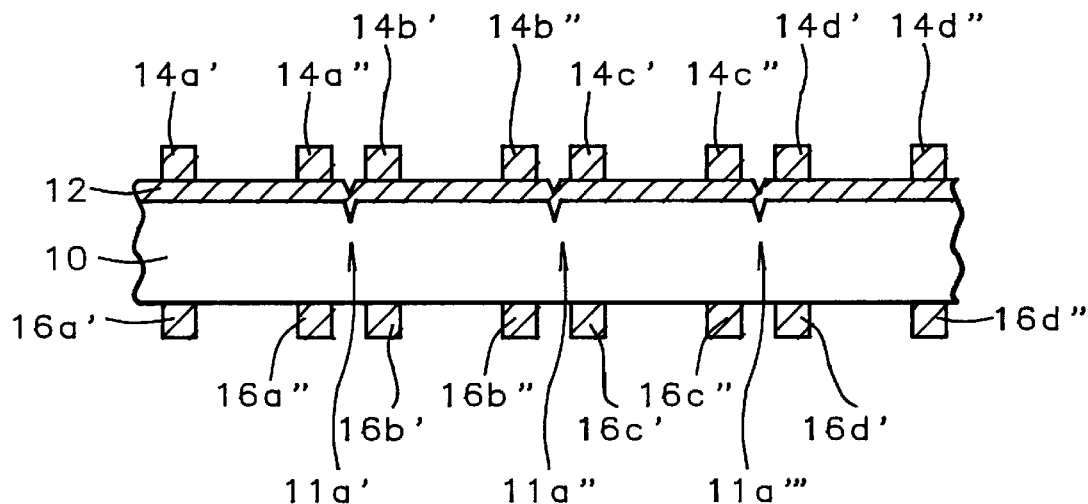

Referring now to FIG. 3, there is shown a schematic cross-sectional diagram illustrating the results of further processing of the insulator substrate 10 whose schematic cross-sectional diagram is illustrated in FIG. 2. Shown in FIG. 3 is the presence of: (1) a series of patterned upper conductor lead layers 14a', 14a", 14b', 14b", 14c', 14c", 14d' and 14d" formed upon the exposed surface of the blanket resistive layer 12; and (2) a corresponding series of patterned lower conductor lead layers 16a', 16a", 16b', 16b", 16c', 16c", 16d' and 16d" formed upon the bottom surface of the insulator substrate 10. Within the method of the present invention, both the series of patterned upper conductor lead layers 14a', 14a", 14b', 14b", 14c', 14c", 14d' and 14d" and the series of patterned lower conductor lead layers 16a', 16a", 16b', 16b", 16c', 16c", 16d' and 16d" are formed through a non-photolithographic printing method. Although such non-photolithographic printing methods may include, but are not limited to, non-photolithographic screen printing methods and non-photolithographic energy beam induced printing methods (such as but not limited to laser beam induced printing methods employing gaseous conductor precursor materials), the preferred embodiment of the method of the present invention preferably employs a non-photolithographic screen printing method where the series of patterned upper conductor lead layers 14a', 14a", 14b', 14b", 14c', 14c", 14d' and 14d" and the series of patterned lower conductor lead layers 16a', 16a", 16b', 16b", 16c', 16c", 16d' and 16d" are formed through screen printing and subsequently firing a conductor paste chosen from the group of conductor pastes including but not limited to silver, silver alloy, gold, gold alloy, copper, copper alloy, palladium, palladium alloy, nickel and nickel alloy conductor pastes. Typically and preferably, the conductor paste is fired at a temperature of from about 400 to about 600 degrees centigrade for a time period of from about 5 to about 10 minutes. Preferably, the conductor paste is coated to a thickness such that upon firing the thickness of each patterned conductor layer within the series of patterned upper conductor lead layers 14a', 14a", 14b', 14b", 14c', 14c", 14d' and 14d" and the series of patterned lower conductor lead layers 16a', 16a", 16b', 16b", 16c', 16c", 16d' and 16d" is from about 8 to about 10 microns in thickness.

Following screen printing and firing of the conductive paste to form the series of patterned upper conductor lead layers 14a', 14a", 14b', 14b", 14c', 14c", 14d' and 14d" and the series of patterned lower conductor lead layers 16a', 16a", 16b', 16b", 16c', 16c", 16d' and 16d", the insulator substrate 10 is then preferably thermally annealed to stabilize the thermal coefficient of resistivity (TCR) of the blanket thin film resistive layer 12. Preferably, the insulator substrate 10 is annealed at a temperature of from about 200 to about 600 degrees centigrade for a time period of from about 1 to about 20 hours.

As is understood by a person skilled in the art, the screen printed conductive paste may be fired to form the patterned upper conductor lead layers 14a', 14a", 14b', 14b", 14c', 14c", 14d' and 14d" and the patterned lower conductor lead layers 16a', 16a", 16b', 16b", 16c', 16c", 16d' and 16d" simultaneously with annealing the insulator substrate 10 to stabilize the thermal coefficient of resistivity (TCR) of the blanket thin film resistive layer 12, should an appropriate overlap of thermal annealing conditions and requirements exist.

Figure 4:
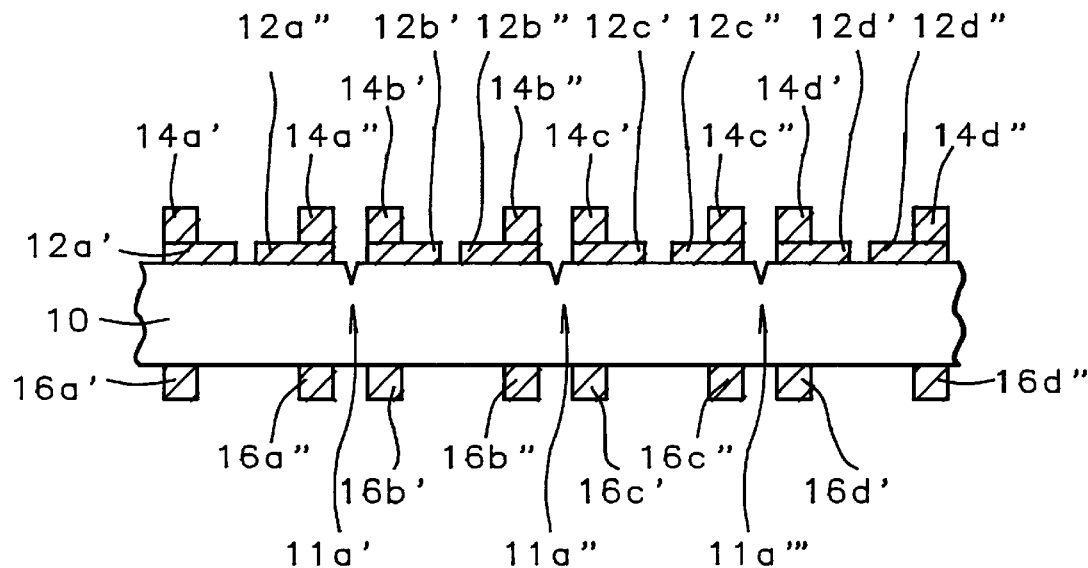

Referring now to FIG. 4, there is shown a schematic cross-sectional diagram illustrating the results of further processing of the insulator substrate 10 whose schematic cross-sectional diagram is illustrated in FIG. 3. Shown in FIG. 4 is the results of: (1) patterning the blanket thin film resistive layer 12 to form a bi-directional array of patterned thin film resistive layers, where each patterned thin film resistive layer within the bi-directional array of patterned thin film resistive layers is contained within an island within the bi-directional array of islands formed by the lateral scribe lines and the horizontal scribe lines within the insulator substrate 10; and (2) trimming the patterned thin film resistive layers upon the islands within the insulator substrate 10 to form a series of trimmed patterned thin film resistive layers 12a', 12a", 12b', 12b", 12c', 12c", 12d' and 12d". A schematic perspective-view diagram of a portion of the insulator substrate 10 so formed which includes the patterned upper conductor lead layers 14a' and 14a" is illustrated in FIG. 8.

Figure 8:
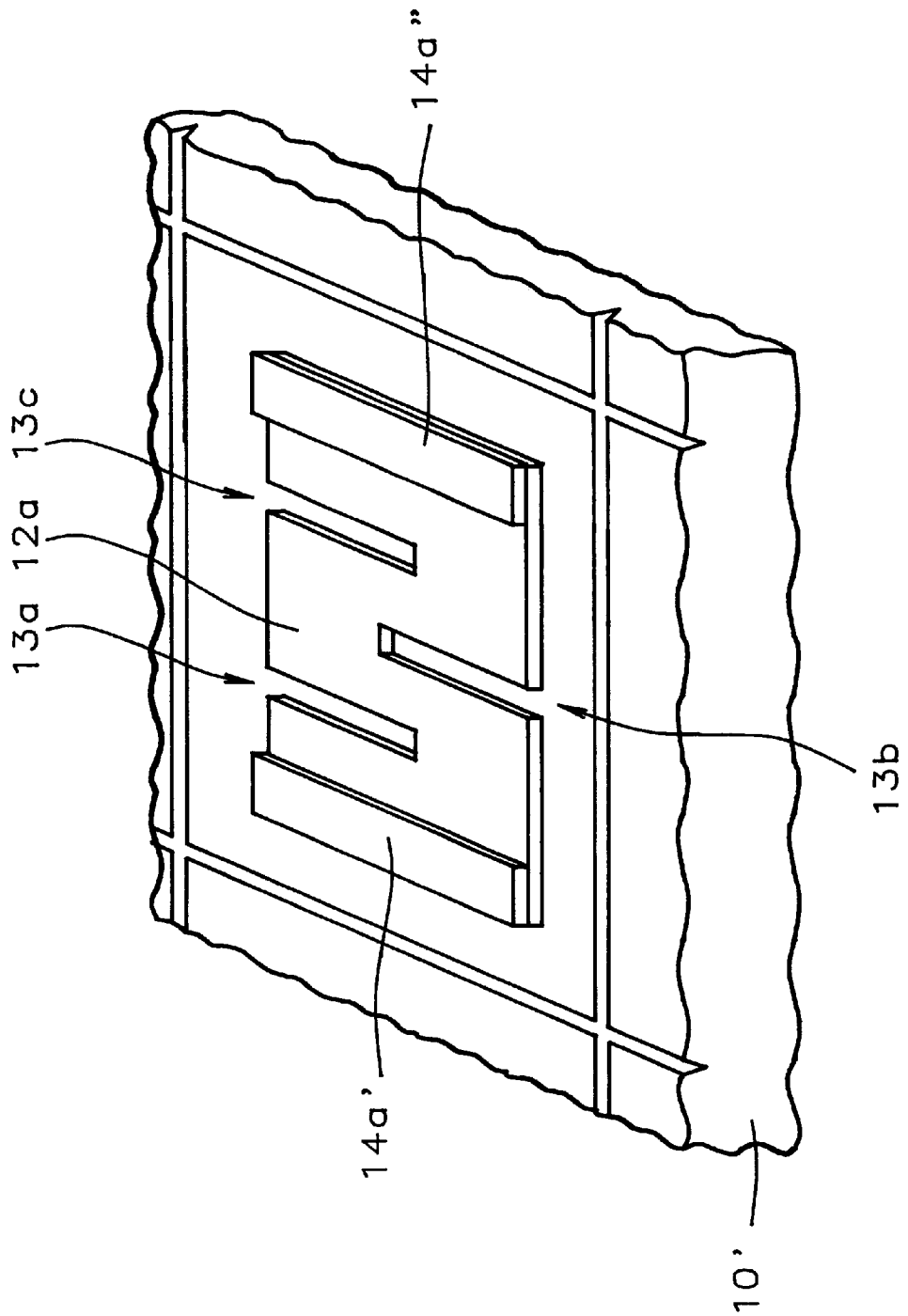
FIG. 8 shows a schematic perspective-view diagram corresponding in part with the schematic cross-sectional diagram of FIG. 4.

As shown in FIG. 8, there is the insulator substrate 10' having an island formed therein defined by a pair of horizontal scribe lines and a pair of lateral scribe lines. Formed upon the island is the trimmed patterned thin film resistor layer 12a having a series of kerfs 13a, 13b and 13c formed therethrough exposing the insulator substrate 10' and having the pair of patterned upper conductor lead layers 14a' and 14a" formed thereupon. As is illustrated by the schematic perspective-view diagram of FIG. 8, the trimmed patterned thin film resistive layer 12a is formed in a serpentine pattern which provides for ready adjustment of resistance of the trimmed patterned thin film resistive layer 12a.

Similarly, with the non-photolithographic printing method through which is formed the series of patterned upper conductor lead layers 14a', 14a", 14b', 14b", 14c', 14c", 14d' and 14d" and the series of patterned lower conductor lead layers 16a', 16a", 16b', 16b", 16c', 16c", 16d' and 16d", the blanket thin film resistive layer 12 as illustrated in FIG. 3 is patterned and subsequently trimmed (or alternatively trimmed and subsequently patterned) to form the series of trimmed patterned thin film resistive layers 12a', 12a", 12b', 12b", 12c', 12c", 12d' and 12d" as illustrated in FIG. 4 through a non-photolithographic etching method. Preferably the non-photolithographic etching method is a non-photolithographic energy beam etching method which employs an energy beam such as but not limited to a laser beam, a focused ion beam or a focused electron beam. More preferably, the non-photolithographic energy beam etching method employs a laser beam at a wavelength of from 532 to 1064 nanometers and an energy density of from about 0.1 to about 10 watts per square centimeter projected beam size. When patterning the blanket thin film resistive layer 12 to form the series of patterned thin film resistor layers the width of the laser beam is preferably from about 30 to about 200 microns, while when trimming the series of patterned thin film resistor layers to form the series of trimmed patterned thin film resistor layers 12a', 12a", 12b', 12b", 12c', 12c", 12d' and 12d", the diameter of the laser beam is preferably from about 10 to about 100 microns in width.

As is understood by a person skilled in the art, the insulator substrate 10 whose schematic cross-sectional diagram is illustrated in FIG. 4 may be formed through an alternative ordering of the foregoing thin film resistor fabrication processes in accord with the preferred embodiment of the method of the present invention. In particular, while the preferred embodiment of the method of the present invention discloses the formation of a series of patterned upper conductor lead layers upon a blanket thin film resistive layer and the subsequent patterning and trimming of the blanket thin film resistive layer to form a series of trimmed patterned thin film resistive layers, a functionally equivalent thin film resistor may also be formed through the method of the present invention while first patterning and/or trimming the blanket thin film resistive layer and subsequently forming upon the patterned thin film resistive layers, the trimmed thin film resistive layer or the trimmed patterned thin film resistive layers so formed the series of patterned upper conductor lead layers. The method of the present invention is transparent to the ordering of: (1) the patterning of the blanket thin film resistive layer; (2) the trimming of the blanket thin film resistive layer; and (3) the formation of the patterned upper conductor lead layers and the patterned lower conductor lead layers.

Figure 5:
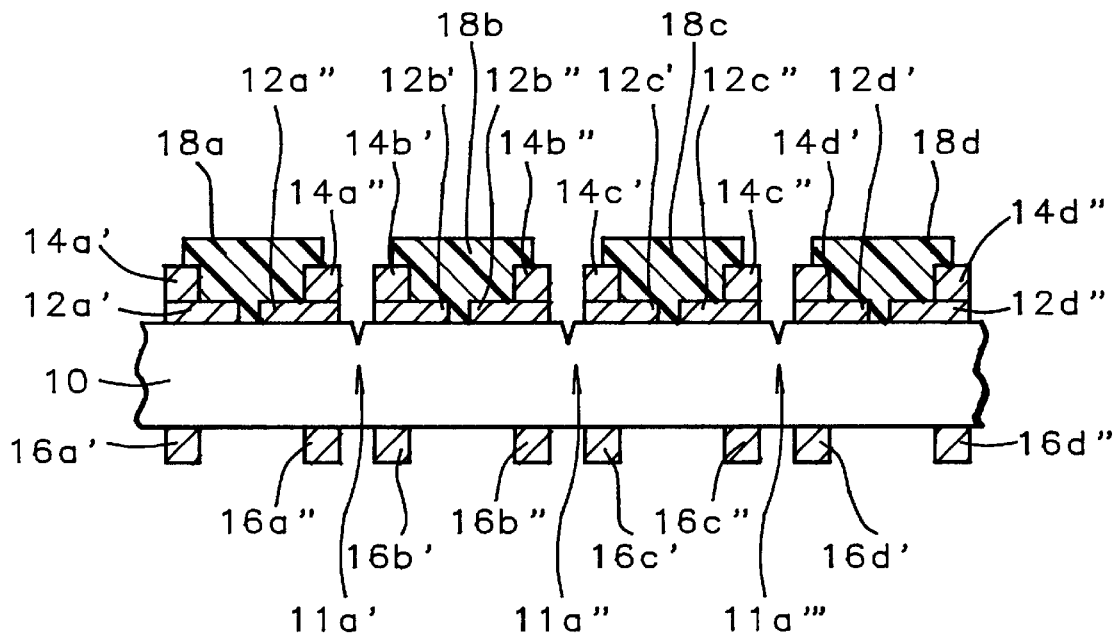

Referring now to FIG. 5, there is shown a schematic cross-sectional diagram illustrating the results of further processing of the insulator substrate 10 whose schematic cross-sectional diagram is illustrated in FIG. 4. Shown in FIG. 5 is a schematic cross-sectional diagram of the insulator substrate 10 otherwise equivalent to the insulator substrate 10 whose schematic cross-sectional diagram is illustrated in FIG. 4 but upon whose surface is formed a series of patterned overcoat sealant layers 18a, 18b, 18c and 18d corresponding with portions of the trimmed patterned thin film resistive layers 12a'/12a", 12b'/12b", 12c'/12c" and 12d'/12d" to encapsulate those portions of the trimmed patterned thin film resistive layers 12a'/ 12a", 12b'/12b", 12c'/12c" and 12d'/12d". The patterned overcoat sealant layers 18a, 18b, 18c and 18d may be formed from any of several sealant materials as are commonly employed in the art of thin film resistor chip fabrication, including but not limited to epoxy sealants, urethane sealants and silicone sealants. Within the preferred embodiment of the method of the present invention, the patterned overcoat sealant layers 18a, 18b, 18c and 18d are, similarly with the series of patterned upper conductor lead layers 14a', 14a", 14b', 14b", 14c', 14c", 14d' and 14d" and the series of patterned lower conductor lead layers 16a', 16a", 16b', 16b", 16c', 16c", 16d' and 16d", formed through a non-photolithographic printing method, preferably a non-photolithographic screen printing method. Preferably the patterned overcoat sealant layers 18a, 18b, 18c and 18d are formed of a sealant material not susceptible to degradation when exposed to subsequent processing steps through which the insulator layer 10 is subsequently exposed. More preferably, the patterned overcoat sealant layers 18a, 18b, 18c and 18d are formed of an epoxy sealant material screen printed upon the insulator substrate 10 to provide the patterned overcoat sealant layers 18a, 18b, 18c and 18d each of a thickness of from about 10 to about 30 microns.

Figure 6:
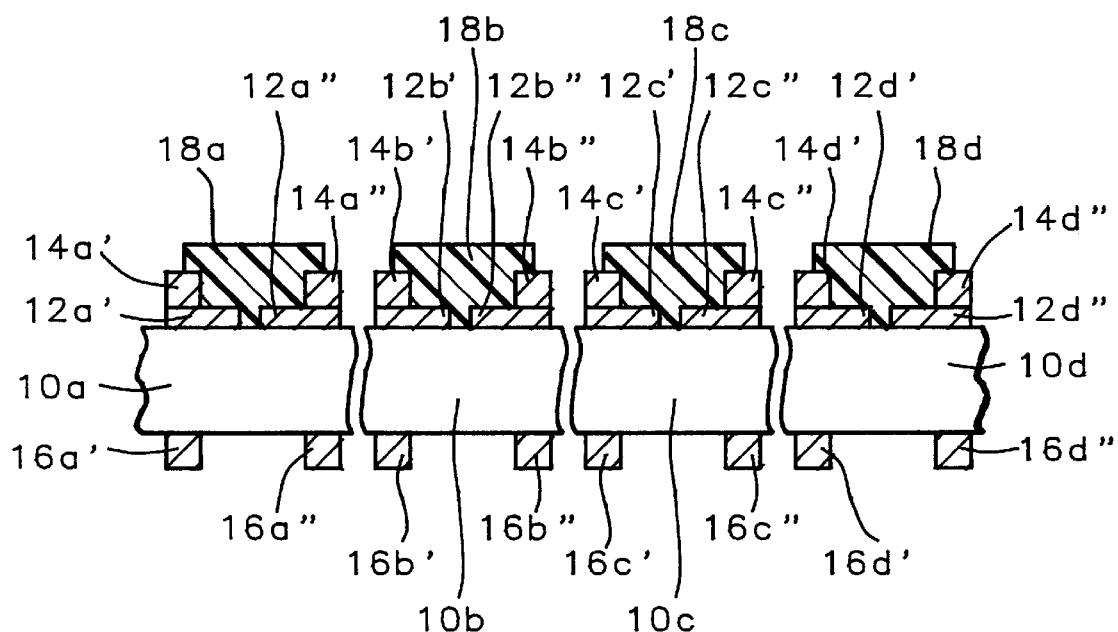

Referring now to FIG. 6, there is shown a schematic cross-sectional diagram illustrating the results of further processing of the insulator substrate 10 whose schematic cross-sectional diagram is illustrated in FIG. 5. Shown in FIG. 6 is a schematic cross-sectional diagram largely similar to the schematic cross-sectional diagram as illustrated in FIG. 5, but wherein the insulator substrate 10 has been parted into the insulator substrate strips 10a, 10b, 10c and 10d. Due to the presence of the lateral scribe lines 11a', 11a" and 11a'" which in part define the islands within the insulator substrate 10, the insulator substrate 10 may be parted to form the insulator substrate strips 10a, 10b, 10c and 10d through physical fracture without cutting the insulator substrate 10. Preferably, the physical fracture is effectuated through fixturing the insulator substrate 10 over a roller of radius about 1 to about 5 centimeters and sufficiently pressuring the insulator substrate 10 over the roller to induce the physical fracture. Other methods may, however, also be employed in parting the insulator substrate 10 into the insulator substrate strips 10a, 10b, 10c and 10d.

Figure 7:
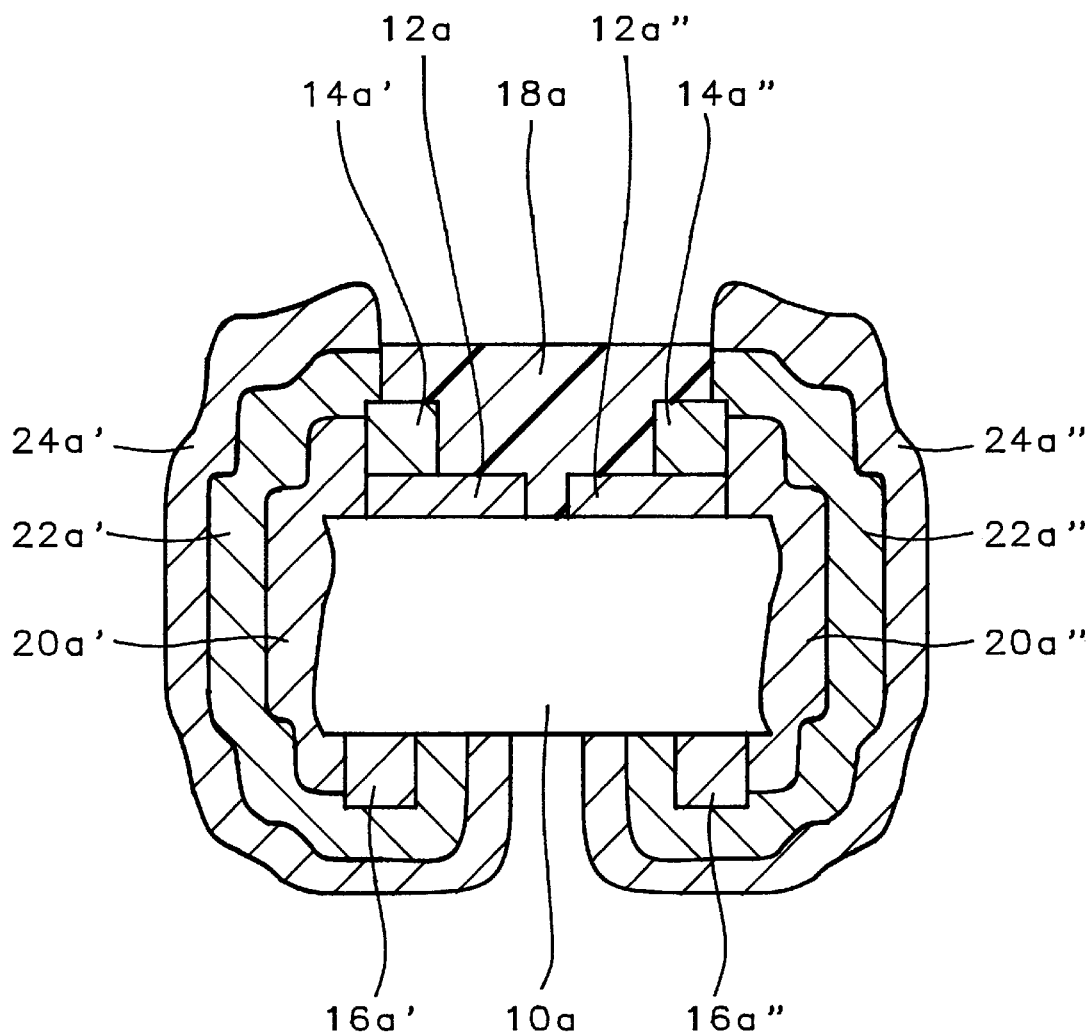

Referring now to FIG. 7, there is shown a schematic cross-sectional diagram illustrating the results of further processing of the insulator substrate strip 10a whose schematic cross-sectional diagram is illustrated in FIG. 6. Shown in FIG. 7 is a schematic cross-sectional diagram of the insulator substrate strip 10a as illustrated in FIG. 6, but upon each edge within a pair of opposite edges of which insulator substrate strip 10a is formed a series of three conductor layers. The two series of three conductor layers so formed includes: (1) a pair of patterned bridging conductor lead layers 20a' and 20a" formed bridging to the corresponding patterned upper conductor lead layers 14a' or 14a" and the corresponding patterned lower conductor lead layers 16a' and 16a"; (2) a pair of patterned terminal conductor layers 22a' and 22a" formed upon the corresponding patterned bridging conductor lead layers 20a' and 20a"; and (3) a pair of patterned solder layers 24a' and 24a" formed upon the pair of patterned terminal conductor layers 22a' and 22a". While each of the foregoing conductor layers within the foregoing two series of three conductor layers may be formed through any of several methods and materials as are known in the art of thin film resistor chip fabrication, preferably the pair of patterned bridging conductor lead layers 20a' and 20a" is formed through a non-photolithographic screen printing method analogous or equivalent to the non-photolithographic screen printing method employed in forming the pair of patterned upper conductor lead layers 14a' and 14a" and the pair of patterned lower conductor lead layers 16a' and 16a". Thus the patterned bridging conductor lead layers 20a' and 20a" are preferably formed through screen printing and firing a conductor paste chosen from the group of conductor pastes including but not limited to silver, silver alloy, gold, gold alloy, copper, copper alloy, palladium, palladium alloy, nickel and nickel alloy conductor pastes. Typically and preferably, the conductor paste is fired at a temperature of from about 400 to about 600 degrees centigrade for a time period of from about 5 to about 10 minutes. Preferably, the conductor paste is coated to a thickness such that upon firing the thickness of each patterned bridging conductor lead layer 20a' or 20a" within the pair of patterned bridging conductor lead layers 20a' and 20a" is formed to a thickness of from about 5 to about 20 microns.

Similarly, although the patterned terminal conductor layers 22a' and 22a", and the patterned solder layers 24a' and 24a", may also be formed through any of several materials through which patterned terminal conductor layers and patterned solder layers are formed when fabricating discrete thin film resistor chips, for the preferred embodiment of the method of the present invention the patterned terminal conductor layers 22a' and 22a" are preferably formed of a nickel or a nickel alloy conductor material, while the patterned solder layers 24a' and 24a" are preferably formed of a lead-tin alloy solder material having a lead composition of from about 5 to about 50 weight percent. The use of nickel or nickel alloy materials when forming the patterned terminal conductor layers 22a' and 22a" and the use of lead-tin alloy solder materials when forming the patterned solder layers 24a' and 24a" typically provides a discrete thin film resistor chip with optimal corrosion resistance and bondability within hybrid circuit microelectronics fabrications. Similarly, although the patterned terminal conductor layers 22a' and 22a", and the patterned solder layers 24a' and 24a", may be formed through any of several methods through which patterned terminal conductor layers and patterned solder layer may be formed within discrete thin film resistor chip fabrication, the patterned terminal conductor layers 22a' and 22a", and the patterned solder layers 24a' and 24a", are each preferably formed through a plating method in order to most efficiently provide the patterned terminal conductor layers 22a' and 22a", and patterned solder layers 24a' and 24a", with the optimal corrosion resistance and bondability within hybrid circuit microelectronics fabrications.

Although not specifically illustrated within FIG. 7, the insulator substrate strip 10a is typically subsequently parted to form from the insulator substrate strip 10a a series of discrete insulator substrate chips having formed thereupon a series of discrete thin film resistors in accord with the schematic cross-sectional diagram of FIG. 7, thus forming a series of discrete thin film resistor chips. The discrete insulator substrate chips are preferably parted from the insulator substrate strip 10a through a method analogous to the method employed in parting the insulator substrate strip 10a from the insulator substrate 10. In particular, the insulator substrate strip 10a is preferably parted to form the insulator substrate chips through physical fracture of the insulator substrate strip 10a along the remaining horizontal scribe lines, without cutting the insulator substrate strip 10a.

Although not specifically illustrated by the schematic cross-sectional diagram of FIG. 7, the insulator substrate strip 10a may be parted to form the discrete thin film resistor chips comprised of the discrete insulator substrate chips having formed thereupon the discrete thin film resistors either prior to or after forming the pair of patterned terminal conductor layers 22a' and 22a" and the pair of patterned solder layers 24a' and 24a" upon the insulator substrate strip 10a. Within the preferred embodiment of the method of the present invention, the insulator substrate strip 10a is preferably parted to form a series of insulator substrate chips having formed thereupon the series of thin film resistors after forming through the non-photolithographic screen printing method the patterned conductor bridge layers 20a' and 20a" and before forming through the plating methods the patterned terminal conductor layers 22a' and 22a" and the patterned solder layers 24a' and 24a". Such a process ordering is preferred within the preferred embodiment of the method of the present invention in order to efficiently allow use of the non-photolithographic screen printing method for forming the patterned bridging conductor lead layers 20a' and 20a" while simultaneously avoiding damage to the patterned terminal conductor layers 22a' and 22a" and the patterned solder layers 24a' and 24a".

Upon parting the insulator substrate strip 10a as is illustrated in FIG. 7 to form a discrete insulator substrate chip having formed thereupon a discrete thin film resistor, there is formed through the method of the present invention a discrete thin film resistor chip which may be employed within hybrid circuit microelectronics fabrications. The discrete thin film resistor chip so formed is formed: (1) while avoiding the use of photolithographic methods, materials and apparatus in forming the discrete thin film resistor chip; and (2) while avoiding the use of a highly polished insulator substrate when forming the discrete thin film resistor chip.

As is understood by a person skilled in the art, the preferred embodiment of the method of the present invention is illustrative of the method of the present invention rather than limiting of the method of the present invention. Revisions and modifications may be made to materials, structures and dimensions through which is formed the discrete thin film resistor chip through the preferred embodiment of the method of the present invention while still forming a thin film resistor in accord with the method of the present invention, as defined by the accompanying claims.

What is claimed is:

1. A method for forming a thin film resistor comprising:
   providing an insulator substrate;
   forming upon the insulator substrate a blanket thin film resistive layer;
   forming through a non-photolithographic printing method upon the blanket thin film resistive layer a patterned conductor lead layer; and
   removing through a non-photolithographic energy beam etching method a portion of the blanket thin film resistive layer to form upon the substrate a patterned thin film resistive layer.

2. The method of claim 1 wherein the insulator substrate is chosen from the group of insulator substrates consisting of glass insulator substrates and ceramic insulator substrates.

3. The method of claim 1 wherein the blanket thin film resistive layer is formed from a resistive material chosen from the group of resistive materials consisting of tantalum nitride resistive materials, tantalum silicide resistive materials, tantalum-chromium alloy resistive materials, nickel-chromium alloy resistive materials, chromium silicide resistive materials and higher order alloys of the foregoing resistive materials.

4. The method of claim 1 wherein the non-photolithographic printing method is chosen from the group of non-photolithographic printing methods consisting of screen printing methods and energy beam induced printing methods.

5. The method of claim 1 wherein the non-photolithographic printing method is a screen printing method employing a conductor paste chosen from the group of conductor pastes consisting of silver, silver alloy, gold, gold alloy, palladium, palladium alloy, nickel, nickel alloy, copper and popper alloy conductor pastes.

6. The method of claim 1 wherein the non-photolithographic energy beam etching method is a non-photolithographic energy beam etching method chosen from the group of non-photolithographic etching methods consisting of laser beam etching methods, focused electron beam etching methods and focused ion beam etching methods.

7. The method of claim 1 further comprising scribing the insulator substrate to define a contiguous substrate chip formed within the insulator substrate, the contiguous substrate chip having formed thereupon the patterned thin film resistive layer and the patterned conductor lead layer, thus forming from the contiguous substrate chip a contiguous thin film resistor chip.

8. The method of claim 7 wherein the insulator substrate is scribed prior to forming upon the insulator substrate the blanket thin film resistive layer.

9. The method of claim 7 wherein the insulator substrate is scribed subsequent to forming upon the insulator substrate the blanket thin film resistive layer.

10. The method of claim 7 wherein the contiguous thin film resistor chip is parted from the insulator substrate by physical fracture of the insulator substrate to form a discrete thin film resistor chip without cutting the insulator substrate.

11. The method of claim 1 wherein the thin film resistor is formed into a thin film resistor component selected from the group of thin film resistor components consisting of thin film resistor chips, thin film resistor array chips and thin film resistor network chips.

* * * * *